(12) United States Patent
Baldwin

(10) Patent No.: US 8,183,117 B2
(45) Date of Patent: May 22, 2012

(54) DEVICE LAYOUT IN INTEGRATED CIRCUITS TO REDUCE STRESS FROM EMBEDDED SILICON-GERMANIUM

(75) Inventor: Gregory Charles Baldwin, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 42 days.

(21) Appl. No.: 12/858,586

(22) Filed: Aug. 18, 2010

(65) Prior Publication Data

US 2012/0043612 A1 Feb. 23, 2012

(51) Int. Cl.
*H01L 21/336* (2006.01)
(52) U.S. Cl. .................................. 438/300; 438/285
(58) Field of Classification Search .................. 438/300, 438/285
See application file for complete search history.

(56) References Cited

U.S. PATENT DOCUMENTS

| | | | |
|---|---|---|---|
| 7,407,860 B2 * | 8/2008 | Kim et al. ............... | 438/300 |
| 2006/0286736 A1 * | 12/2006 | Orlowski et al. .......... | 438/199 |
| 2008/0023692 A1 | 1/2008 | Wirbeleit et al. | |

OTHER PUBLICATIONS

Ghani et al., "A 90 nm High Volume Manufacturing Logic Technology Featuring Novel 45nm Gate Length Strained Silicon CMOS Transistors", Technical Digest, IEEE Int'l Electron Devices Meeting (2003), pp. 978-980.

Luo et al., "Design of High Performance PFETs with Strained Si Channel and Laser Anneal", Technical Digest, IEEE Int'l Electron Devices Meeting (2005), pp. 489-492.

Li et al., "Channel Strain Characterization in Embedded SiGe by Nano-beam Diffraction", 214th Electrochemical Society Meeting Abstracts 802, 2437 (2008).

* cited by examiner

*Primary Examiner* — Long Pham
(74) *Attorney, Agent, or Firm* — Jacqueline J. Garner; Wade J. Brady, III; Frederick J. Telecky, Jr.

(57) ABSTRACT

An integrated circuit including one or more transistors in which source and drain regions are formed as embedded silicon-germanium (eSiGe). Guard ring structures in the integrated circuit are formed in single-crystal silicon, rather than in eSiGe. In one example, p-channel MOS transistors have source/drain regions formed in eSiGe, while the locations at which p-type guard rings are formed are masked from the recess etch and the eSiGe selective epitaxy. Defects caused by concentrated crystal strain at the corners of guard rings and similar structures are eliminated.

9 Claims, 16 Drawing Sheets

DEVICE LAYOUT IN INTEGRATED CIRCUITS TO REDUCE STRESS FROM EMBEDDED SILICON-GERMANIUM

CROSS-REFERENCE TO RELATED APPLICATIONS

Not applicable.

STATEMENT REGARDING FEDERALLY SPONSORED RESEARCH OR DEVELOPMENT

Not applicable.

BACKGROUND OF THE INVENTION

This invention is in the field of semiconductor integrated circuits. Embodiments of this invention are directed to reduction of stress in the semiconductor material in certain device structures.

Recent advances in semiconductor technology as applied to integrated circuits include the use of "strain engineering" (or, alternatively, "stress engineering") in the manufacture of semiconductor device structures. It has been discovered that the tuning of strain in the crystal lattice of metal-oxide-semiconductor (MOS) transistor channel regions can enhance carrier mobility in those regions. As is fundamental in MOS device technology, the source/drain current (i.e., drive) of an MOS transistor in both the triode and saturation regions is proportional to carrier mobility in the channel region. In a general sense, compressive stress enhances hole mobility in the channel region of a p-channel MOS transistor, and tensile stress enhances electron mobility in the channel region of an n-channel MOS transistor. Typically, p-channel MOS transistors exhibit lower drive capability than n-channel MOS transistors in typical modern integrated circuits. As such, strain engineering techniques are more typically applied to p-channel MOS transistors than to n-channel MOS transistors, in current day manufacturing technology.

Various strain engineering approaches are known in the art. According to the approach known as "embedded SiGe" (also referred to as "eSiGe"), the source and drain regions of a p-channel MOS transistor structure are etched from the silicon substrate or well region, and are replaced with a silicon-germanium alloy formed by selective epitaxy. Because of the germanium atoms within the crystal lattice, the germanium constituting as much as 30% (atomic) of the alloy, eSiGe exhibits a larger lattice constant than does silicon (i.e., the distance between unit cells in the crystal lattice for SiGe is greater than in single-crystal silicon). Embedded eSiGe source/drain regions thus apply compressive stress to the channel region of the p-channel MOS transistor being formed. This compressive stress in the channel increases the hole mobility of the p-channel MOS transistor, and enhances its performance.

FIGS. 1a through 1d illustrate, in cross section, the fabrication of a conventional p-channel MOS transistor including eSiGe source/drain regions. FIG. 1a illustrates a portion of the integrated circuit structure including p-type substrate 4, with n-well 6 formed at selected locations of the surface of substrate 4, by way of ion implantation and diffusion in the conventional manner. Shallow trench isolation structures 5 are disposed at selected locations of the surface of substrate 4, formed by conventional etch and deposition processes. Dopant implant to adjust the threshold voltage of the eventual transistor is typically also performed at this stage of manufacture. At the stage of the process shown in FIG. 1b, thermal oxidation or deposition of gate dielectric 7 has been followed by the deposition, photolithography, and etch of polysilicon gate structure 8. In this example, hard mask 9 is used to protect polysilicon gate structure 8 from the polysilicon etch, and remains in place.

To form the embedded SiGe source/drain regions in this conventional process, gate dielectric 7 is removed from the source/drain regions, and exposed locations of n-well 6 are etched, at locations outside of gate electrode 8, to form recesses 10 into the underlying single-crystal silicon, as shown in FIG. 1c. Hard mask 9 protects gate structure 8 from the recess etch, but is eroded somewhat by this etch. Recesses 10 are thus located at the source/drain regions of the transistor being formed at this location of substrate 4, essentially self-aligned with gate structure 8. Following the recess etch, selective epitaxy of a silicon-germanium alloy is then performed, filling the recesses with embedded SiGe structures 12 as shown in FIG. 1d. SiGe structures 12 are typically doped in situ during the epitaxy, and also by subsequent ion implantation, to become heavily doped p-type, forming the source and drain regions of this transistor. Sidewall dielectric spacers 13 may be formed prior to source/drain implant on the sidewalls of gate structure 8, by deposition and anisotropic etch, to define more lightly-doped source/drain extensions.

As suggested in FIG. 1d, embedded SiGe structures 12 exert compressive strain on channel region 14 underlying gate electrode 8, because the presence of germanium atoms increases the lattice constant of SiGe structures 12 relative to the surrounding silicon. This compressive strain increases the mobility of holes in channel region 14, enhancing the current drive of this p-channel transistor in an "on" state.

By way of further background, many integrated circuits include "guard ring" structures. Guard rings are typically formed as a diffused region surrounding one or more transistors or other devices in the integrated circuit, and to which contact is made via metal or another conductor to reverse bias the p-n junction between the guard ring and the substrate or well into which it is formed. Guard rings have many purposes in conventional integrated circuits, including decoupling external noise from reaching the protected devices interior of the guard ring, providing a large junction area for purposes of dissipating energy from electrostatic discharge (ESD) events, and, when present at the perimeter of the integrated circuit chip, presenting a barrier to ionic contamination entering from the edges of the chip.

BRIEF SUMMARY OF THE INVENTION

Embodiments of this invention provide active region guard ring structures within an integrated circuit, and a method of forming the same, in a process compatible with embedded silicon-germanium (eSiGe) source/drain regions.

Embodiments of this invention provide such structures and a method that can be implemented within modern design automation systems to ensure that lattice defects due to compressive strain of eSiGe regions are minimized.

Other objects and advantages of this invention will be apparent to those of ordinary skill in the art having reference to the following specification together with its drawings.

This invention may be implemented into a method of fabricating metal-oxide semiconductor (MOS) integrated circuits including embedded silicon-germanium (eSiGe) strain engineering technology. A mask layer is applied to regions of the surface of the semiconducting body at which the active transistors are being formed, to prevent recess etch of guard ring structures and other non-transistor diffused region structures that have significant corners, while allowing recess etch of single-crystal silicon at source/drain regions of transistors formed within or near the masked active structures. The recesses are filled with selective epitaxy of a silicon-germanium alloy. After removal of the mask layer and the selective epitaxy process, the guard ring structures and source/drain regions receive ion implantation of a dopant species of the same conductivity type as the eSiGe source/drain regions.

DETAILED DESCRIPTION OF THE INVENTION

This invention will be described in connection with one or more of its embodiments, namely as implemented into an integrated circuit fabricated according to a complementary metal-oxide-semiconductor (CMOS) technology including one or more guard rings, as it is contemplated that this invention is especially beneficial in such an application. However, it is also contemplated that this invention may be used in other types of integrated circuits utilizing guard rings or other types of active region structures. Accordingly, it is to be understood that the following description is provided by way of example only, and is not intended to limit the true scope of this invention as claimed.

As mentioned above in connection with the Background of the Invention, guard rings and similar structures are often used in modern integrated circuits for a variety of reasons, including decoupling of noise from sensitive nearby devices (i.e., those within the guard ring), absorption of energy from electrostatic discharge events, gettering of ionic contamination from edges of the integrated circuit chip, and the like. As such, guard rings may encircle an entire integrated circuit chip, or may surround or otherwise protect (e.g., if not constructed as a complete ring) transistors and other devices within a portion of an integrated circuit.

Figure 1A:
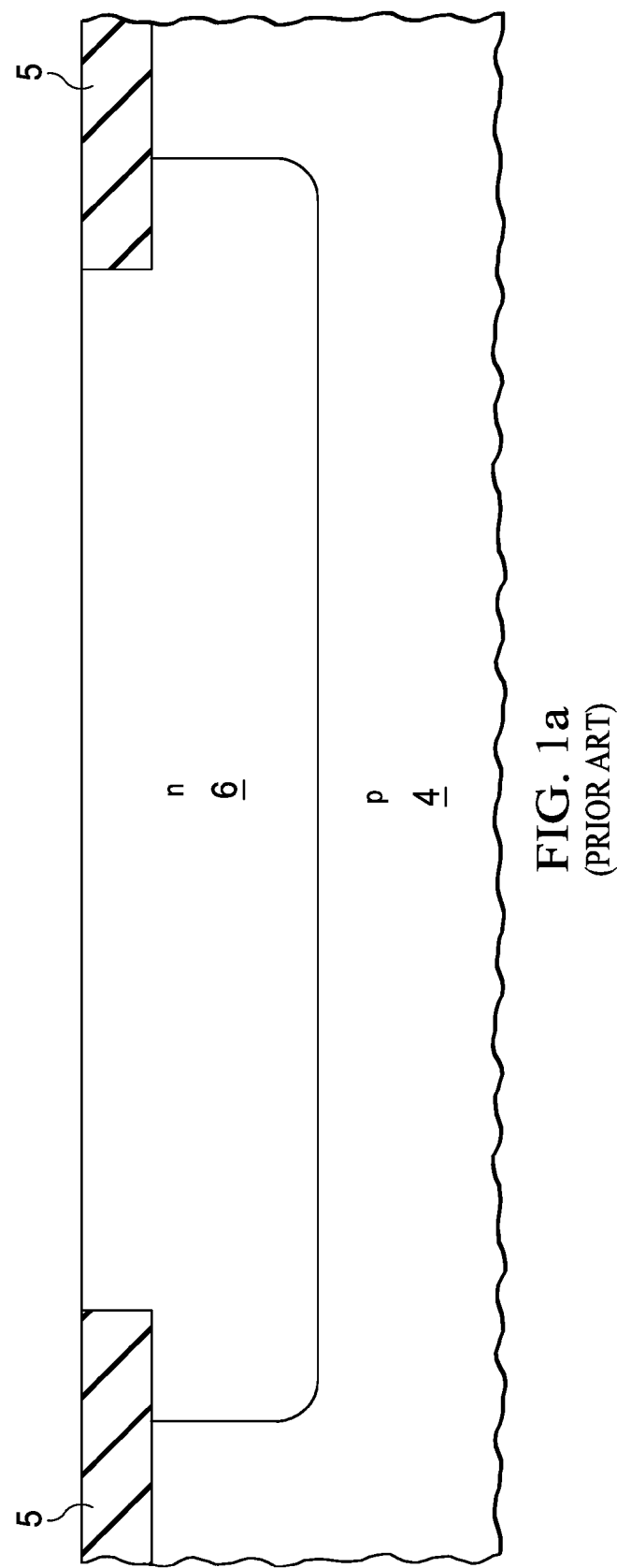
FIGS. 1a through 1d are cross-sectional diagrams illustrating the fabrication of a conventional embedded silicon-germanium transistor.
Figure 1B:
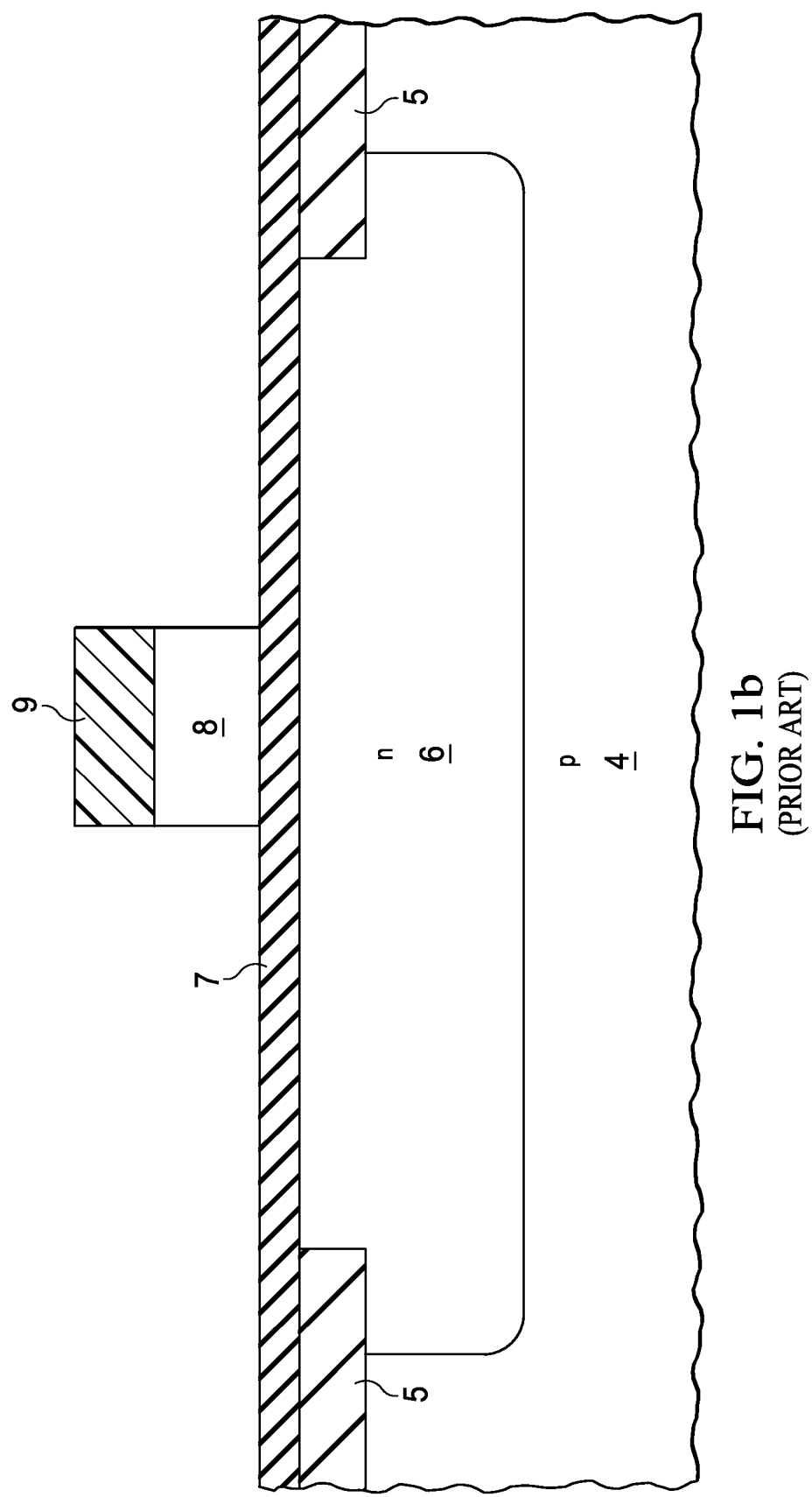
Figure 1C:
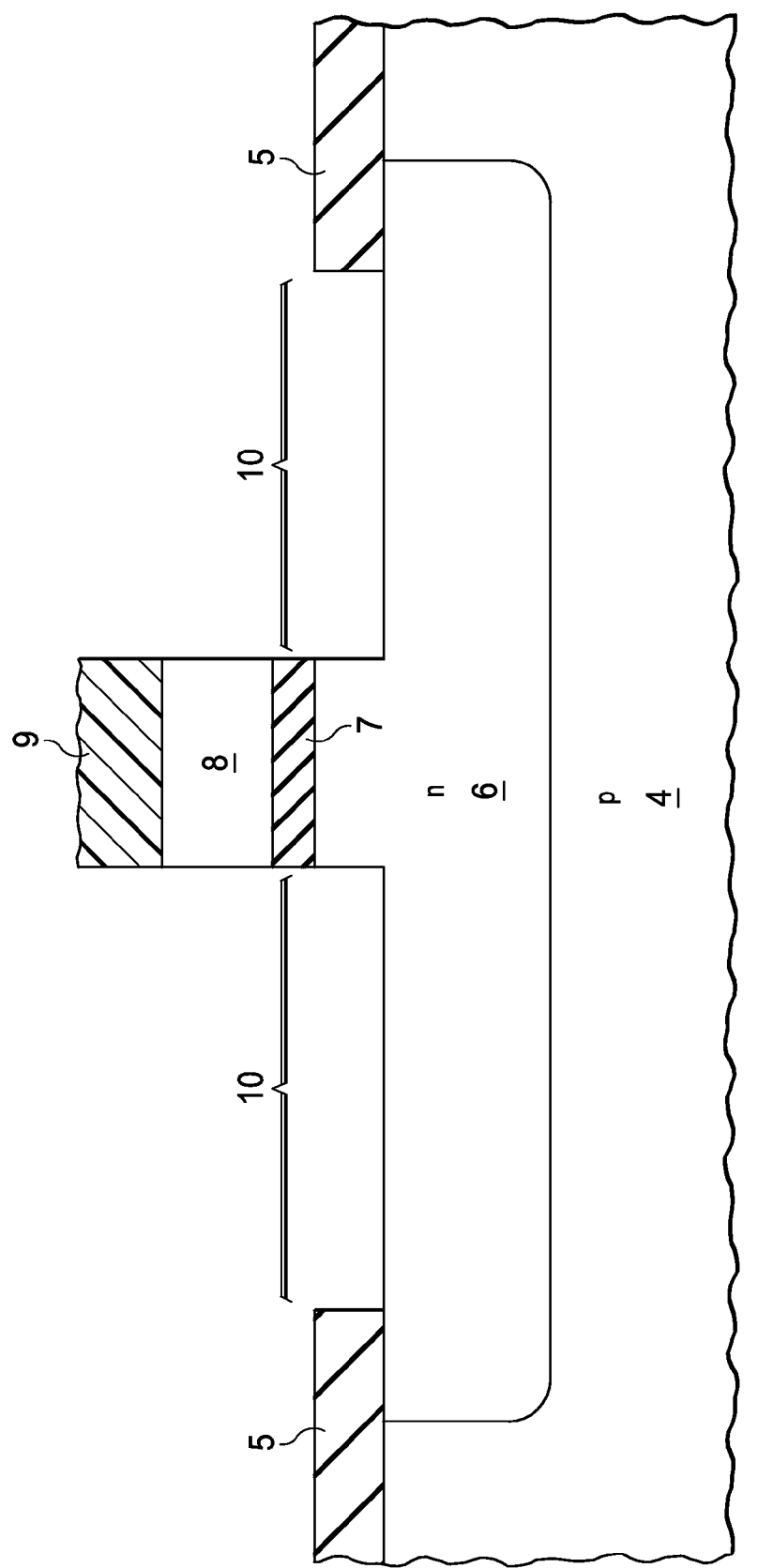
Figure 1D:
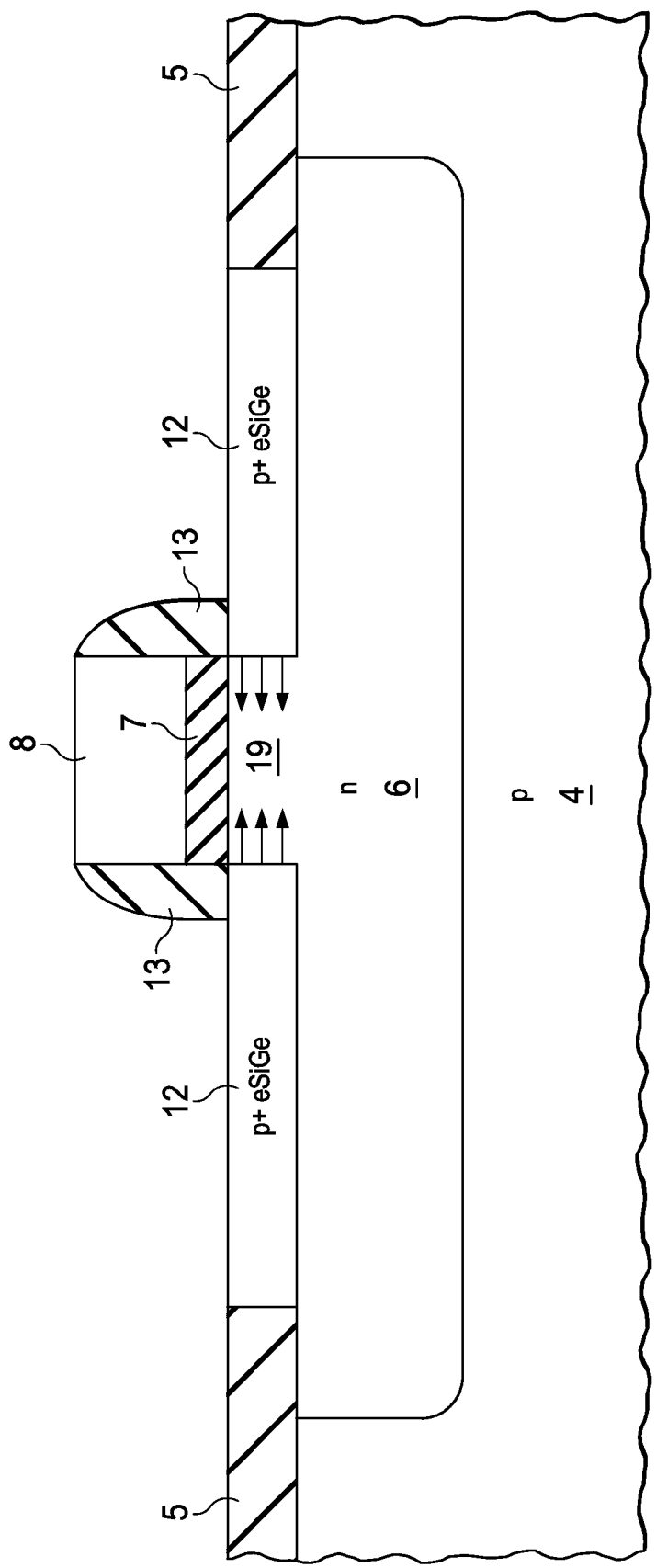
Figure 2A:
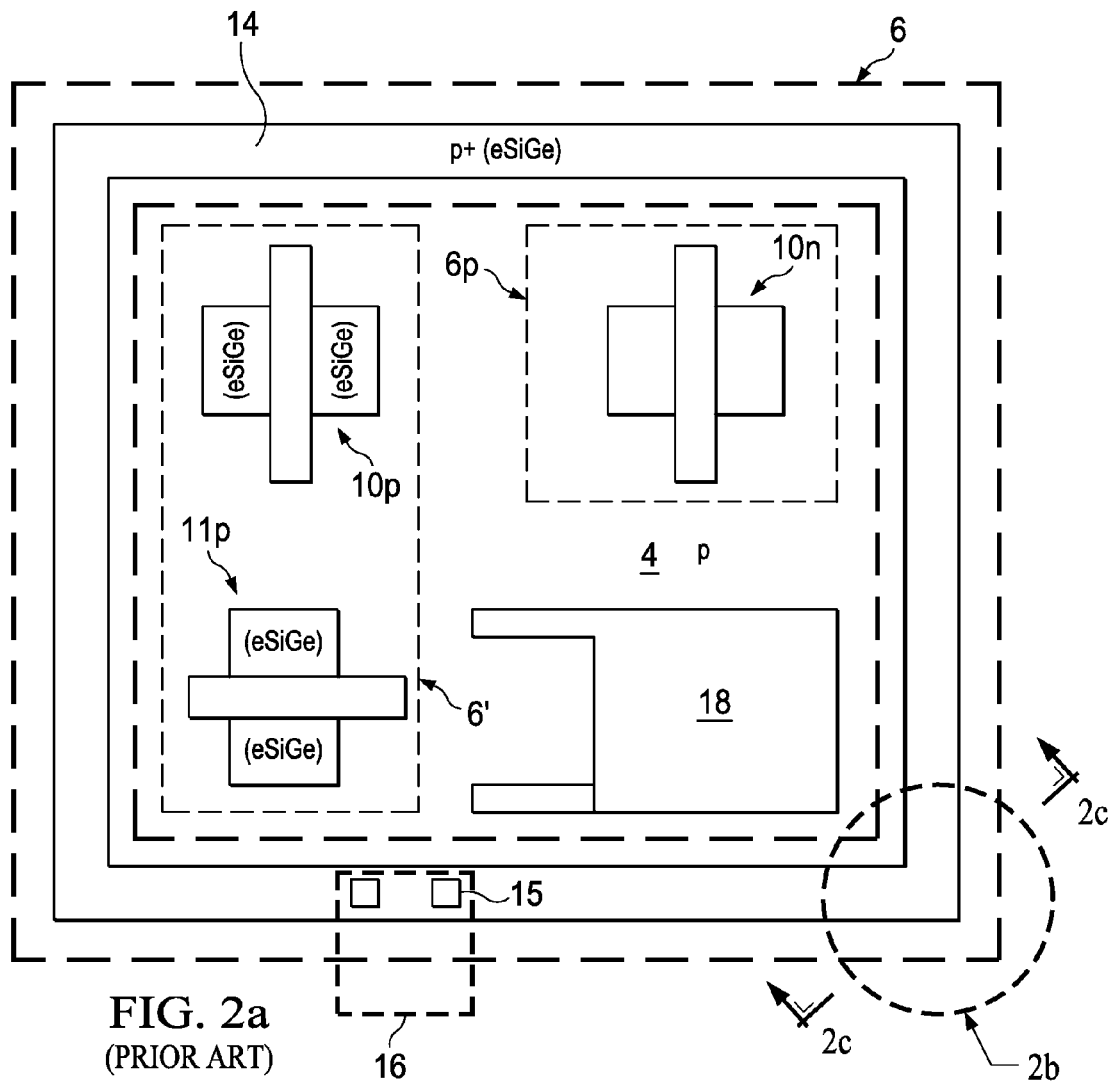
FIGS. 2a and 2b are plan views of a portion of a conventional integrated circuit guard ring.

FIG. 2a illustrates an example of a conventional integrated circuit constructed using embedded silicon-germanium (eSiGe) technology, and including a guard ring. In this example, transistors 10, 11 and capacitor 18 are constructed at a region in the surface of substrate 4 that is encircled by guard ring 14. Guard ring 14 is a heavily-doped p-type region, formed as an eSiGe alloy as will be described below, and disposed within n-well 6 into substrate 4. Transistors 10p, 11p are p-channel MOS transistors with eSiGe source and drain regions. Transistors 10n is an n-channel MOS transistor formed in p-well 6p, in this twin-well construction. Capacitor 18 is an integrated parallel plate capacitor, and may have one plate in an active region of substrate 4 (e.g., a region receiving a source/drain implant), and another plate in polysilicon or a metal layer, or both plates as metal elements. Metal line 16 makes contact to guard ring 14 via contacts 15, to provide the desired bias of guard ring 14 during operation.

The integrated circuit portion shown in FIG. 2a is, as mentioned above, constructed according to conventional eSiGe techniques, such as described above in connection with FIGS. 1a through 1d. According to those techniques, the recess etch and selective epitaxy used to form eSiGe regions in the integrated circuit are applied to all regions receiving the corresponding source/drain implant. In the example of FIG. 2a, every region in the integrated circuit that is to eventually become heavily-doped p-type is exposed to the recess etch and receives the selective epitaxy of eSiGe. This conventional construction ensures that all p+ regions have matching dopant concentration, and facilitates photolithography. Other active regions, such as the source/drain regions of n-channel MOS transistor 10p, are masked so as not to receive the recess etch and selective epitaxy; conventional eSiGe technology is currently used to improve the drive of p-channel transistors only (n-channel devices inherently having better carrier mobility than p-channel devices). As such, the eSiGe source/drain regions of transistors 10p, 11p and also guard ring 14 are formed simultaneously in this conventional approach.

It has been discovered, in connection with this invention, that eSiGe guard ring structures, such as guard ring 14 in the example of FIG. 2a, are vulnerable to stress defects that can cause in functional failure of the integrated circuit. Stress exhibited by relatively small eSiGe regions, such as transistor source/drain regions, is typically safely absorbed in the integrated circuit structure. However, it has been discovered, in connection with this invention, that the stress generated at corners in larger eSiGe structures, such as guard ring 14 in FIG. 2a, can create defects in the crystal structure of the integrated circuit, as will now be described in connection with FIGS. 2b and 2c.

Figure 2B:
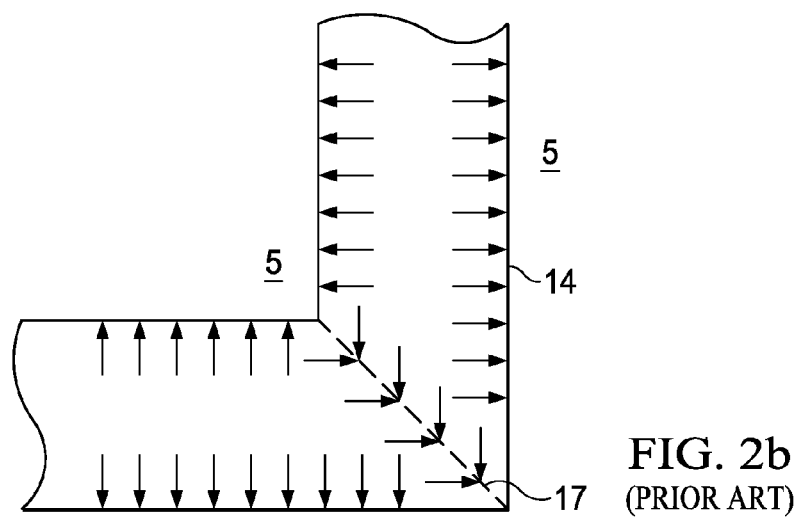
Figure 2C:
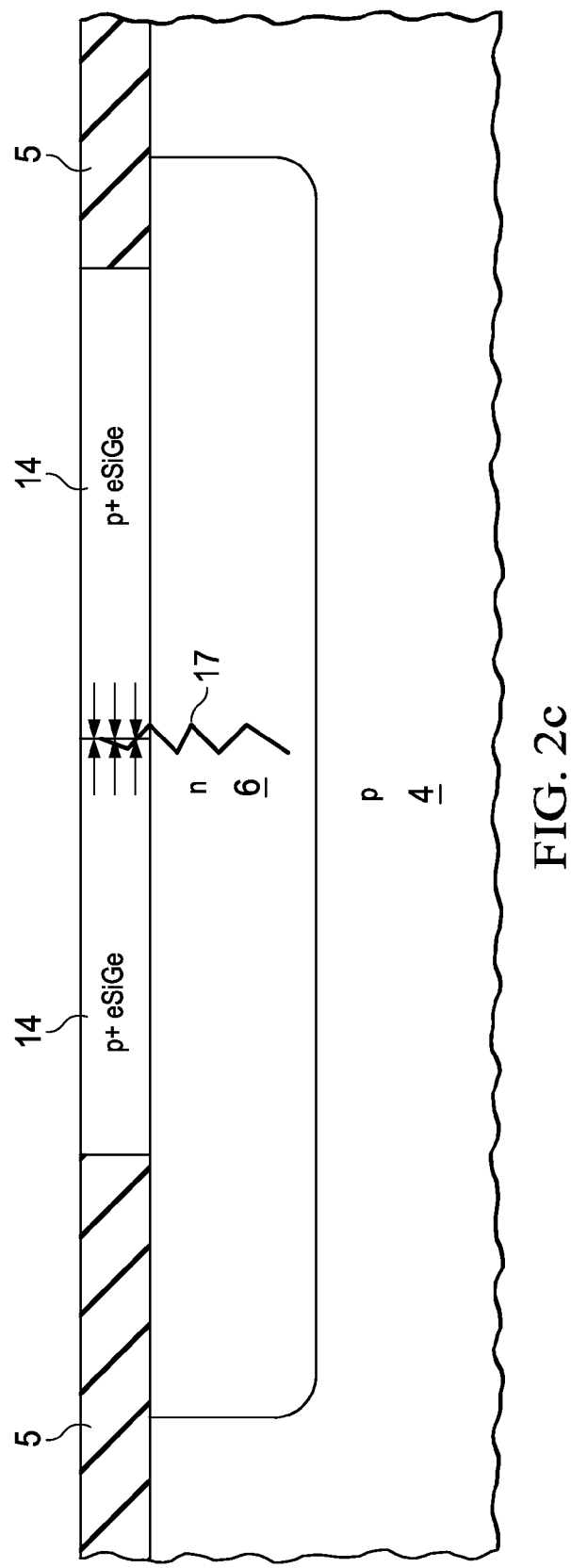
FIG. 2c is a cross-sectional view of the portion of the conventional integrated circuit guard ring shown in FIG. 2b.

FIG. 2b illustrates the strain presented by the eSiGe structure relative to the surrounding silicon, at a corner of guard ring 14. As shown in FIG. 2b, the larger lattice constant of the eSiGe region of guard ring 14 exerts outward strain against isolation structures 5. But at the corner of guard ring 14, this outward strain is concentrated internally. For eSiGe structures that are relatively large (such as the length of guard ring 14 along its sides, in the view of FIG. 2a), this concentrated internal strain can be sufficient to cause a structural defect 17 at this corner. FIG. 2c illustrates this corner region in cross-section, including defect 17 that appears as a stress crack or fracture within the crystalline structure of the eSiGe guard ring 14 itself, and that can extend into well 6 by virtue of the alignment of epitaxial eSiGe with the single crystal structure of well 6. If defect 17 is of sufficient magnitude, a short circuit of the p-n junction between guard ring 14 and well 6 can result, as has been observed.

Therefore, according to this invention, the source of this junction failure of guard ring 14 in this conventional structure of FIGS. 2a through 2c has been discovered to be the mechanical stress at corners of that relatively large eSiGe structure, resulting from the larger lattice constant of the eSiGe crystalline material relative to single crystal silicon.

Figure 3A:
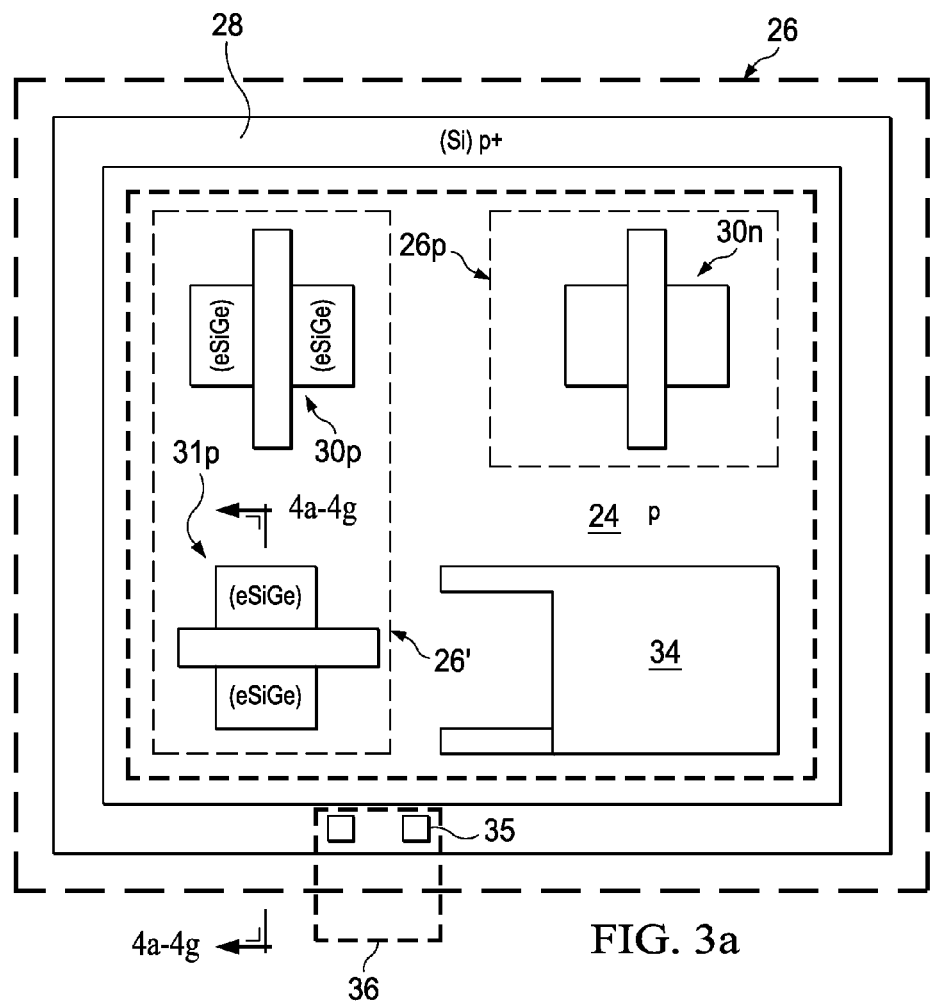
FIGS. 3a through 3c are plan views of a portion of an integrated circuit constructed according to embodiments of the invention.
Figure 3B:
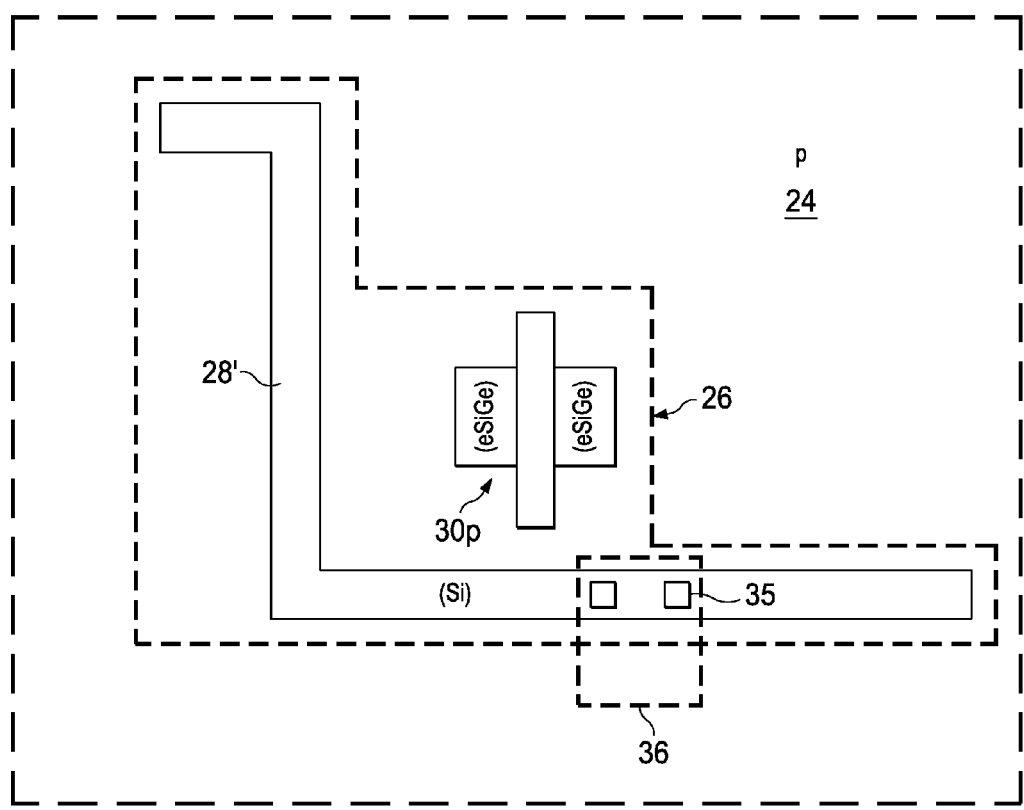
Figure 3C:
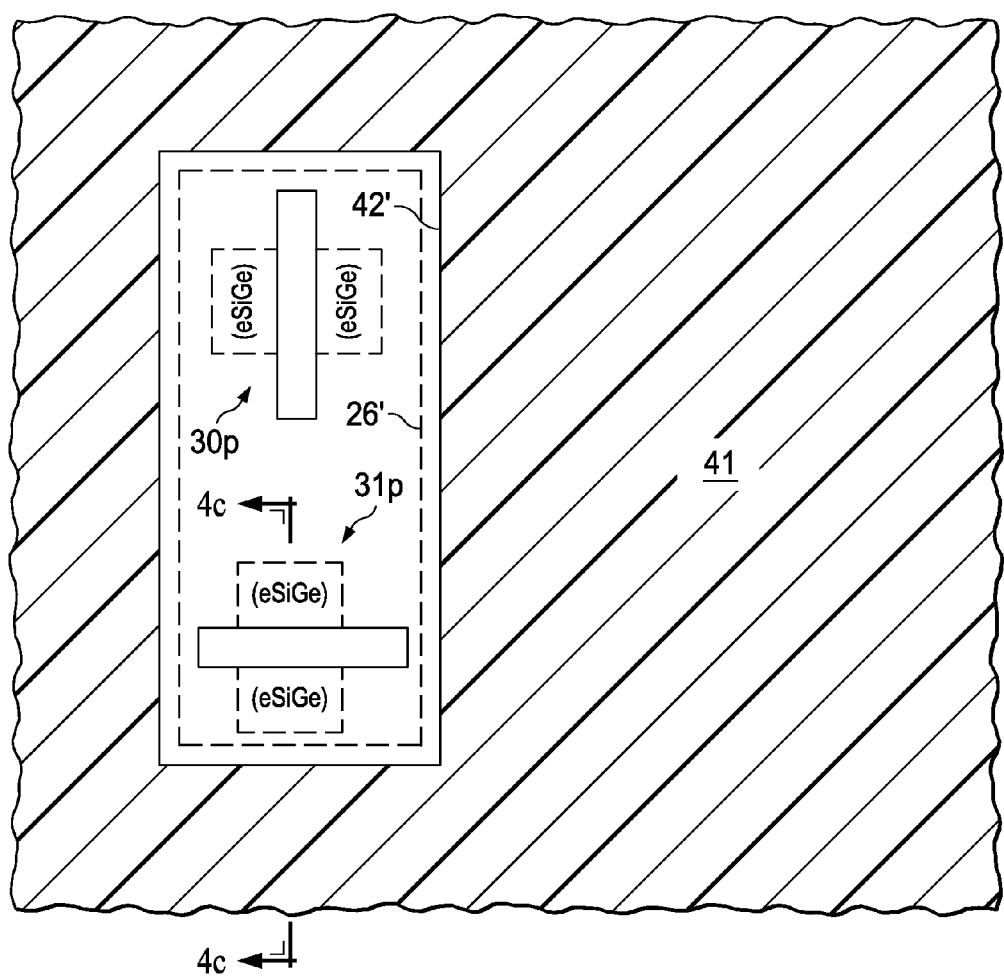

Referring now to FIGS. 3a through 3c, the construction of an integrated circuit according to embodiments of this invention will now be described, in which this vulnerability to junction failure is avoided. FIG. 3a illustrates, in plan view, a portion of an integrated circuit similar to that described above relative to FIG. 2a, as formed at a surface of substrate 24. In this embodiment of the invention, p+ guard ring 28 formed of single-crystal silicon (as will be described below), is located within n-well 26 and surrounds transistors 30p, 31p, 30n, and capacitor 34 in this example. Guard ring 28 may encircle the entirety of the integrated circuit at its perimeter or surround only an interior portion of the integrated circuit including certain devices; alternatively, multiple instances of guard ring 28 may be provided, including one at the perimeter and one or more interiorly disposed. Metal conductor 36 makes electrical contact to guard ring 28 by way of contacts 35, to provide the appropriate bias to guard ring 28 in operation of the integrated circuit.

In this example, p-channel MOS transistors 30p, 31p are disposed within a separate n-well 26' from n-well 26 of guard ring 28. Each of transistors 30p, 31p have source and drain regions of eSiGe structures, despite guard ring 28 of single-crystal silicon (and thus not eSiGe). N-channel MOS transistor 30n is formed within p-well 26p in this twin-well structure; alternatively, in a single well process, transistor 30n may be formed into p-type substrate 24 itself. Capacitor 34 may be a poly-to-active, metal-to-active, metal-to-poly, metal-to-metal, or other type of integrated circuit capacitor. Of course, more or fewer devices and components of various construction and function (e.g., resistors, diodes, etc.) may also or instead be disposed within the bounds of guard ring 28, depending on the desired circuit function. Metal conductors (not shown) will of course be provided to make the desired interconnection among the devices within the region bounded by guard ring 28, in the conventional manner.

As evident from FIG. 3a, the arrangement of transistors 30p, 30n, 31p and capacitor 34 within the region surrounded by guard ring 28 is essentially the same as in the conventional example of FIG. 2a. However, as noted above, p+ guard ring 28 is not formed of eSiGe, but rather is formed as a doped region of single crystal silicon at the surface of substrate 24 (in this case, within n-well 26). This construction of guard ring 28 as doped single-crystal silicon carries out the desired function of a guard ring in decoupling noise, absorbing electrostatic discharge energy, and capturing ionic contamination, etc., without adversely affecting circuit performance. It is recognized, according to this invention, that enhancement of carrier mobility in the silicon adjacent to guard ring 28 does not provide significant benefit to the function of guard ring 28, certainly not to the extent that such enhancement assists transistor drive. In addition, guard ring 28 may be constructed with less than full p+ dopant concentration of the eSiGe source and drain regions of transistors 30p, 31p, as its function as a guard structure is not strongly dependent on its dopant concentration. As such, the construction of guard ring 28 without use of eSiGe technology does not degrade circuit performance. Meanwhile, transistors 30p, 31p within the bounds of guard ring 28 are constructed to include eSiGe source and drain regions, and thus attain the benefit of the enhanced carrier mobility in the channel provided by that technology.

However, by realizing guard ring 28 as a doped region at the surface of the single-crystal silicon, the vulnerability of the integrated circuit to defects caused by concentration of crystal lattice strain at the corners of guard ring 28, as described above relative to FIGS. 2b and 2c, is eliminated in the arrangement of FIG. 3a. No additional chip area is required by this improved construction and, as discussed above, neither circuit functionality nor guard ring utility is compromised by this construction.

FIG. 3b illustrates an alternative arrangement of a portion of an integrated circuit according to an embodiment of the invention. In this case, guard region 28' does not surround devices that are constructed to include eSiGe structures, such as the source and drain regions of p-channel MOS transistor 30p. Rather, guard region 28' is a relatively large doped region that extends along two sides of transistor 30p, and includes one or more corners (two corners, in this example). Because of the length (i.e., size) of guard region 28', and because it includes one or more corners, guard region 28' would be vulnerable to defects at those corners if constructed from eSiGe as described above in connection with FIGS. 2a through 2c. In this example, guard region 28' is formed as a doped region of single-crystal silicon, as described above in connection with FIG. 3a. As a result, transistor 30p enjoys the performance enhancement provided by its eSiGe source and drain regions, while guard region 28' avoids vulnerability to defect at its corners. Circuit performance is not contemplated to be adversely affected to any significant extent, considering that the function of guard region 28' (including its serving as a conductor) is not affected by carrier mobility in the surrounding silicon.

FIG. 3b also illustrates another alternative feature, relative to the integrated circuit of FIG. 3a. In FIG. 3b, guard region 28' and transistor 30p reside within the same instance of n-well 26; in FIG. 3a described above, guard ring 28 and transistor 30p reside in different instances of n-well 26. For purposes of this invention, the single-crystal guard ring or region may be placed within the same well as, or in a different well from, one or more nearby transistors realized according to eSiGe technology, depending on the particular bias to be applied, the circuit functionality, and layout considerations.

Referring now to FIGS. 4a through 4g, a process of fabricating an integrated circuit to include guard ring 28 described above relative to FIG. 3a, according to embodiments of this invention, will now be described in detail. A similar process may of course be used to form the integrated circuit shown in FIG. 3b, as well as to fabricate similar structures in a wide range of integrated circuits. This process is described in a relatively generalized fashion; other additional or alternative process steps may be included as appropriate for the particular manufacturing technology, as will be appreciated by those skilled in the art having reference to this specification. As such, this generalized process is provided by way of example only.

Figure 4A:
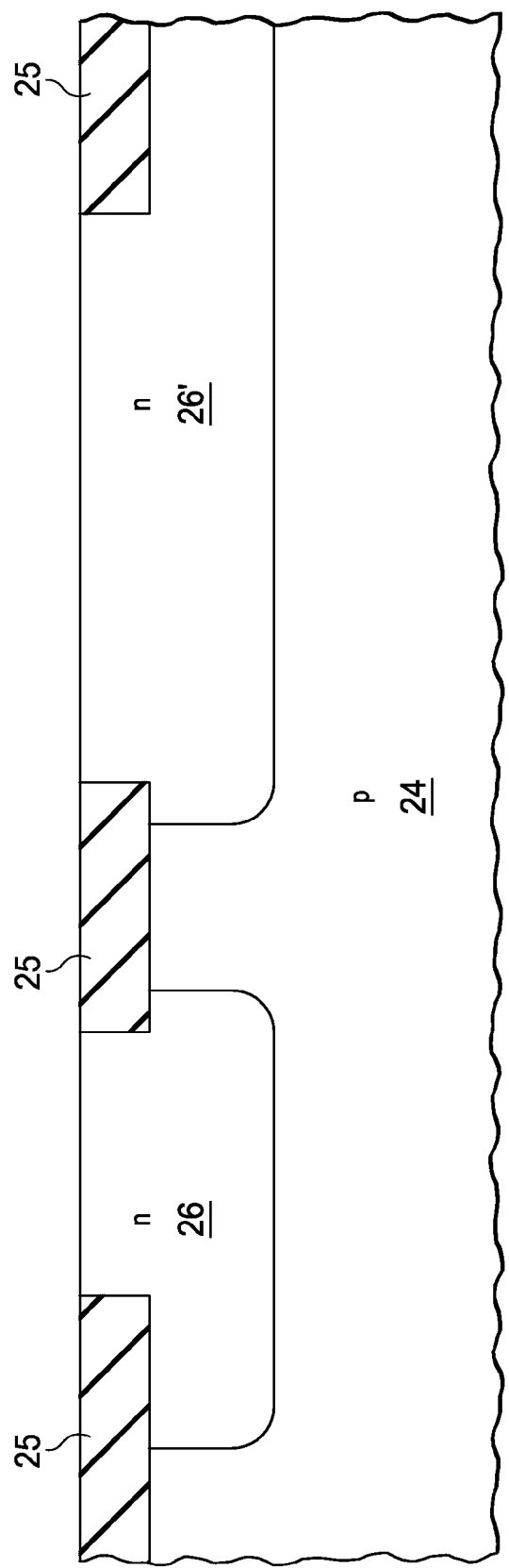
FIGS. 4a through 4g are cross-sectional views illustrating stages in the fabrication of an integrated circuit according to embodiments of the invention.

FIG. 4a illustrates, in cross section, a stage in the fabrication of this integrated circuit following the definition and formation of n-wells 26, 26' at a surface of p-type substrate 24, and also following the definition and formation of shallow trench isolation structures 25. N-wells 26, 26' may be formed by the conventional well formation process, including the photolithographic definition of the locations of the surface of substrate 24 at which n-wells 26, 26' are to be located, and a masked ion implantation and activation anneal. Shallow trench isolation structures 25 are typically formed after definition of wells, by way of a recess etch followed by deposition of silicon dioxide or another dielectric material, and etchback or other planarization. Alternatively, isolation structures may be formed at selected locations of the surface by way of local oxidation of silicon (LOCOS), as fundamental in the art. In this example, n-well 26 is separated from n-well 26' by a region of p-type substrate 24, below one of isolation structures 25.

Figure 4B:
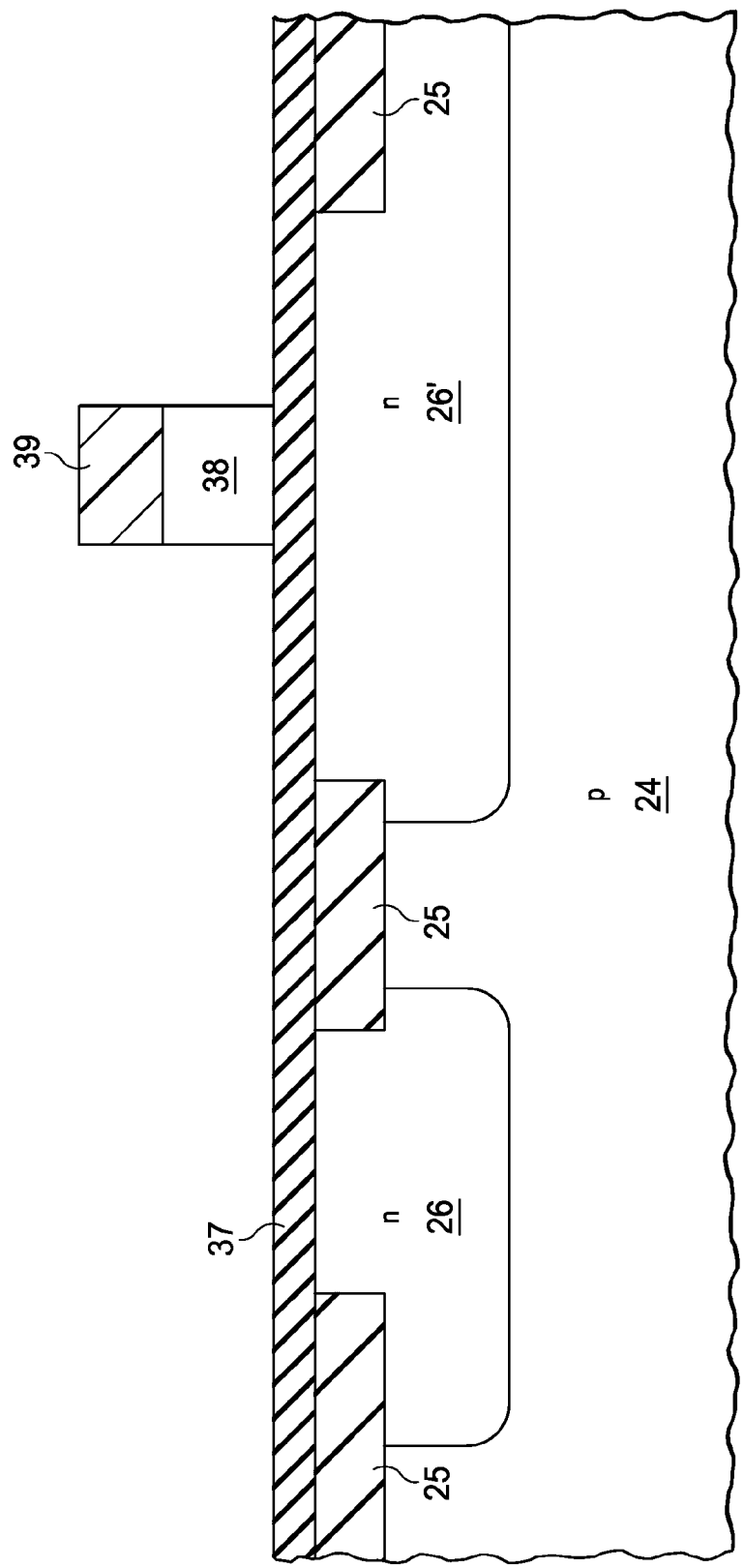

Gate dielectric film 37 is then formed overall, either by chemical vapor deposition or alternatively by thermal oxidation or nitridation of silicon, as shown in FIG. 4b. A gate stack including polysilicon gate element 38 and overlying hard mask 39 is then formed and defined overall, to define the location of transistor gates and polysilicon interconnects. Typically, this gate stack is formed by deposition of polycrystalline silicon overall, followed by deposition of a layer of a hard mask material such as silicon dioxide or silicon nitride. Modern photolithography is then carried out to pattern and etch hard mask 39, and to then use the remaining portions of hard mask 39 to block the etching of the underlying polysilicon layer. The result of this patterning and etching of the gate stack is illustrated in FIG. 4b; in this example, gate dielectric 37 remains overall following polysilicon etch, and as such serves as an "etch stop" for the etching and defining of polysilicon conductors and elements such as gate electrode 38.

Figure 4C:
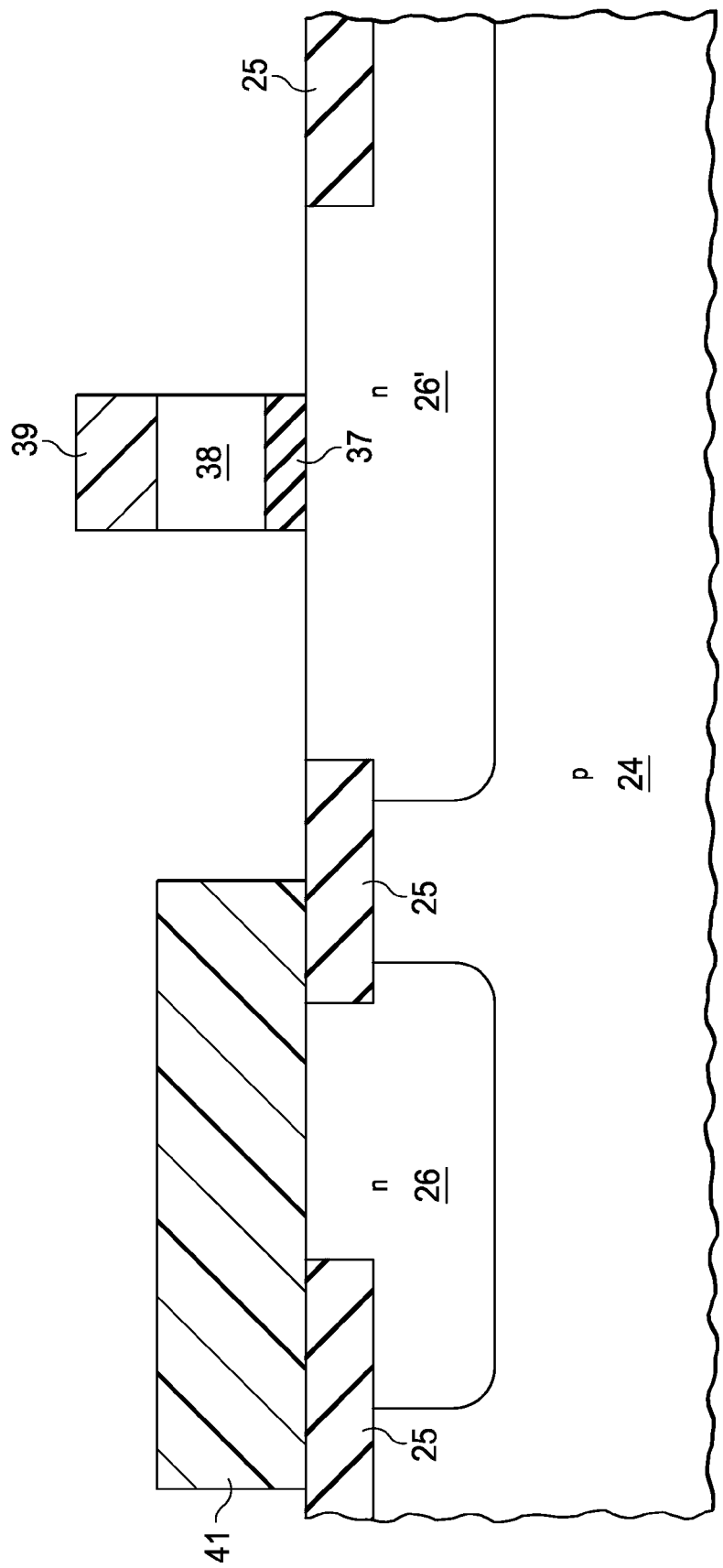

Definition of the location at which embedded silicon-germanium (eSiGe) structures are to be formed is then carried out, as shown in FIG. 4c according to this example of the fabrication process. At this stage of manufacture, hard mask layer 41 is disposed overall. The material and thickness of hard mask layer 41 is selected to withstand a silicon etch; examples of that material include silicon dioxide, silicon nitride, or a combination thereof. Hard mask layer 41 is photolithographically patterned and etched to define those locations that are to be protected from a recess etch into the exposed silicon locations. As shown in FIG. 4c, the gate stack of hard mask 39, polysilicon gate element 38, and underlying gate dielectric 37 remains in place, due to the masking effects of hard mask 39. Gate dielectric 37 is removed in the etch of hard mask layer 41, if not previously.

The locations at which hard mask layer 41 remains at this stage of the fabrication process includes those locations at which guard ring 28 is to be formed, as well as those locations at which devices other than p-channel MOS transistors are to be formed. FIG. 3c illustrates, in plan view, the layout of the integrated circuit at the stage of the process corresponding to FIG. 4c, in eventually fabricating the portion of the integrated circuit shown in FIG. 3a. As shown in FIG. 3c (with reference to FIG. 3a), hard mask layer 41 overlies the portion of the surface at which guard ring 28 is to be formed, as well as the portion of the surface at which other devices such as n-channel MOS transistor 30n and capacitor 34 are to be formed. Opening 42 through hard mask layer 41 is photolithographically defined to expose the locations of the surface of n-well 26' at which p-channel transistors 30p, 31p are to be formed, including isolation structures 25 (FIG. 4c) surrounding the active areas of those transistors.

Figure 4D:
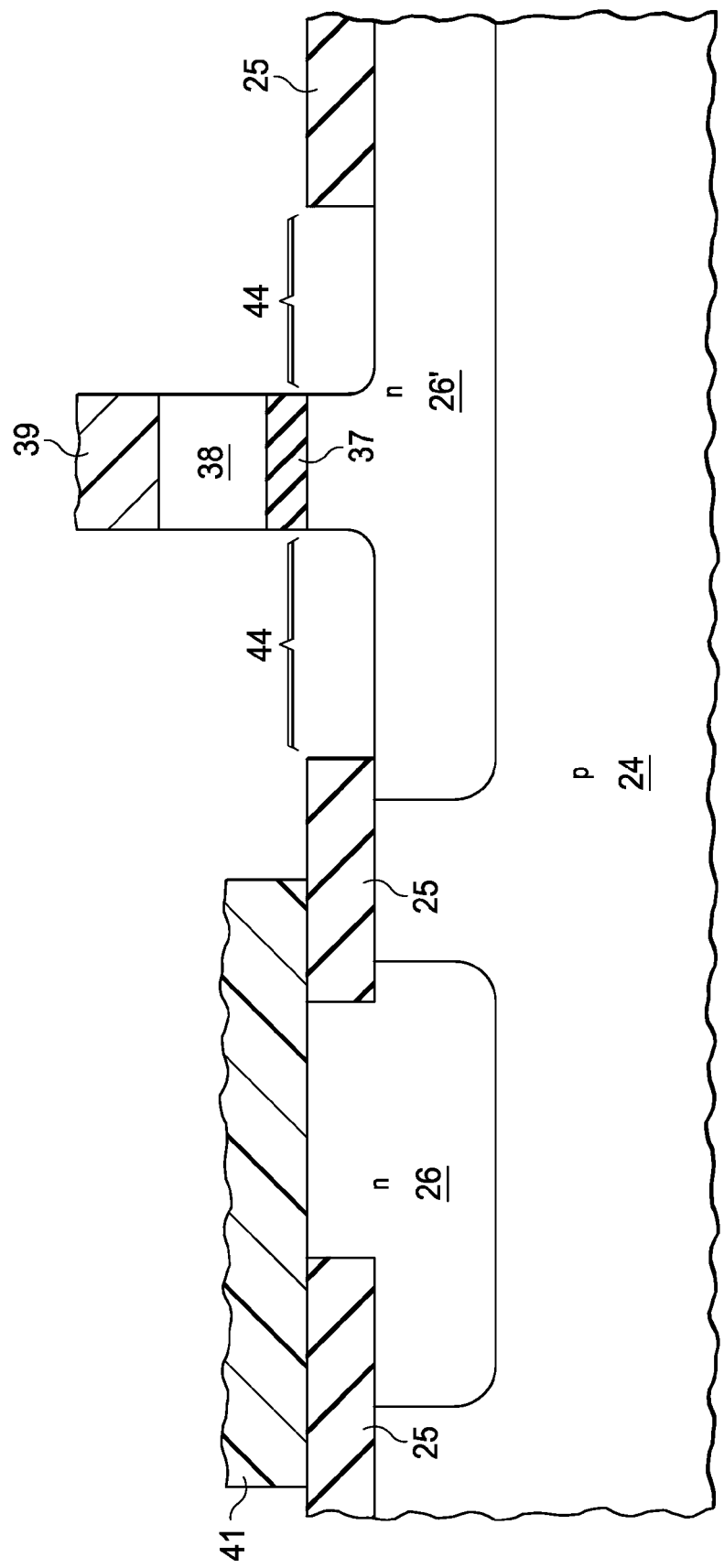

Following the definition of hard mask layer 41 to protect selected locations of the surface, the structure is subjected to a silicon recess etch to define the locations at which embedded silicon-germanium (eSiGe) structures will be formed. As shown in FIG. 4d, the surface of n-well 26' adjacent to the gate stack is removed to a desired depth by this silicon etch, forming recesses 44 into the surface of n-well 26' at those locations. It is contemplated that the depth of recesses 44 will generally be less than the thickness of adjacent isolation structures 25, for example on the order of one-fourth of that thickness (the depth of recesses 44 are somewhat exaggerated in FIG. 4d, for clarity). According to one example, the depth of recesses 44 is between 500 and 1000 Å. This silicon recess etch is anisotropic, to minimize undercut of the silicon underlying gate element 38 and gate dielectric 37 (at which the channel region of transistor 30p will be formed in this example). As indicated in FIG. 4d, hard mask layer 39 in the gate stack and also hard mask layer 41 over guard ring 28 (and other portions of the integrated circuit) can be eroded by this recess etch.

Figure 4E:
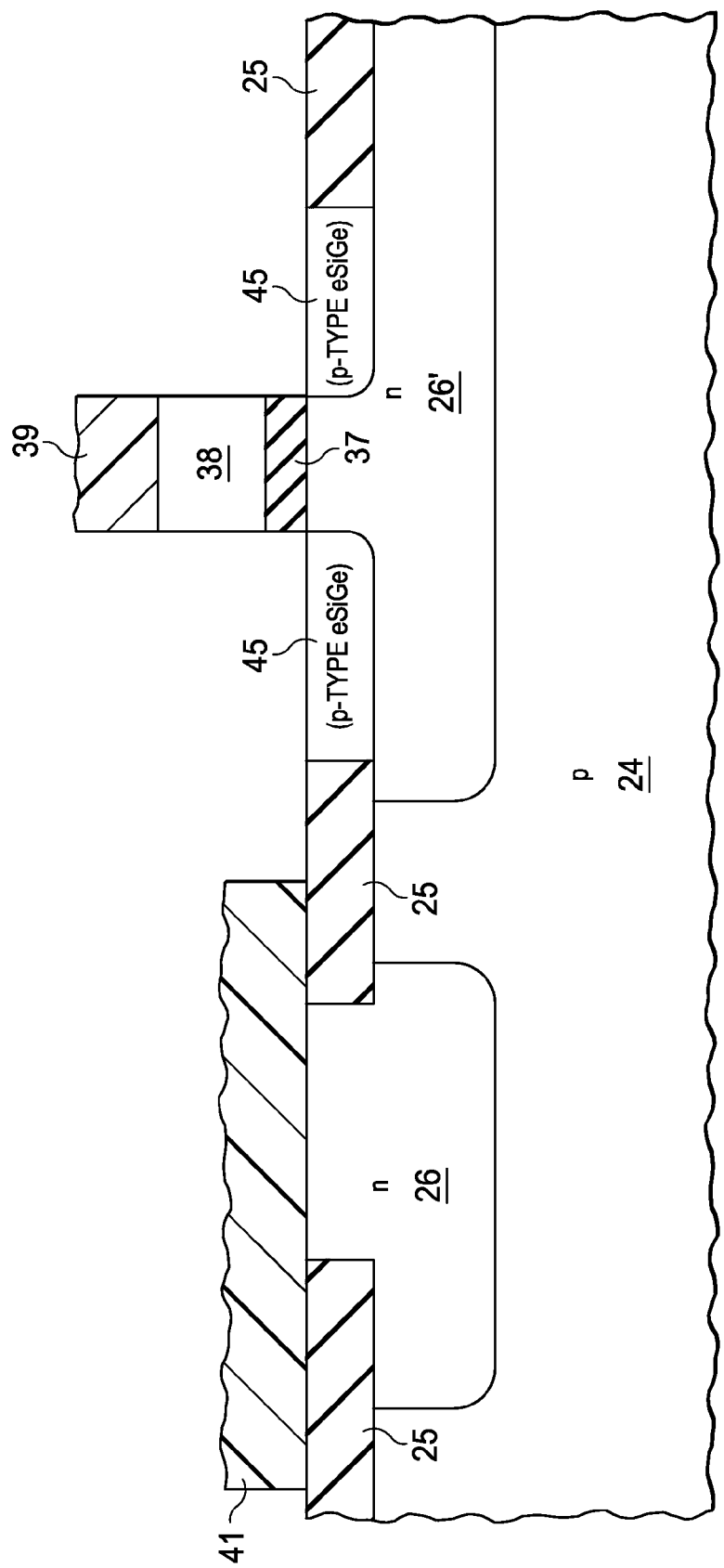

Selective epitaxy of a silicon-germanium alloy is then performed, to form embedded silicon-germanium (eSiGe) structures 45 as shown in FIG. 4e. The Si—Ge epitaxial formation can be performed according to conventional processes for forming such structures. This epitaxy is selective in the sense that the silicon-germanium alloy forms and attaches at exposed locations of silicon (i.e., having an exposed crystal structure to which the epitaxial Si—Ge can bond), and does not form or attach at locations of the structure at which a dielectric film is disposed. As such, hard mask layer structures 39, 41, where present, prevent the formation and attachment of silicon-germanium. The duration of the selective epitaxy is selected so that eSiGe structures 45 approximately fill recesses 44 on either side of the gate stack, as shown in FIG. 4e. An etchback of eSiGe structures 54 can also be performed, if desired.

Figure 4F:
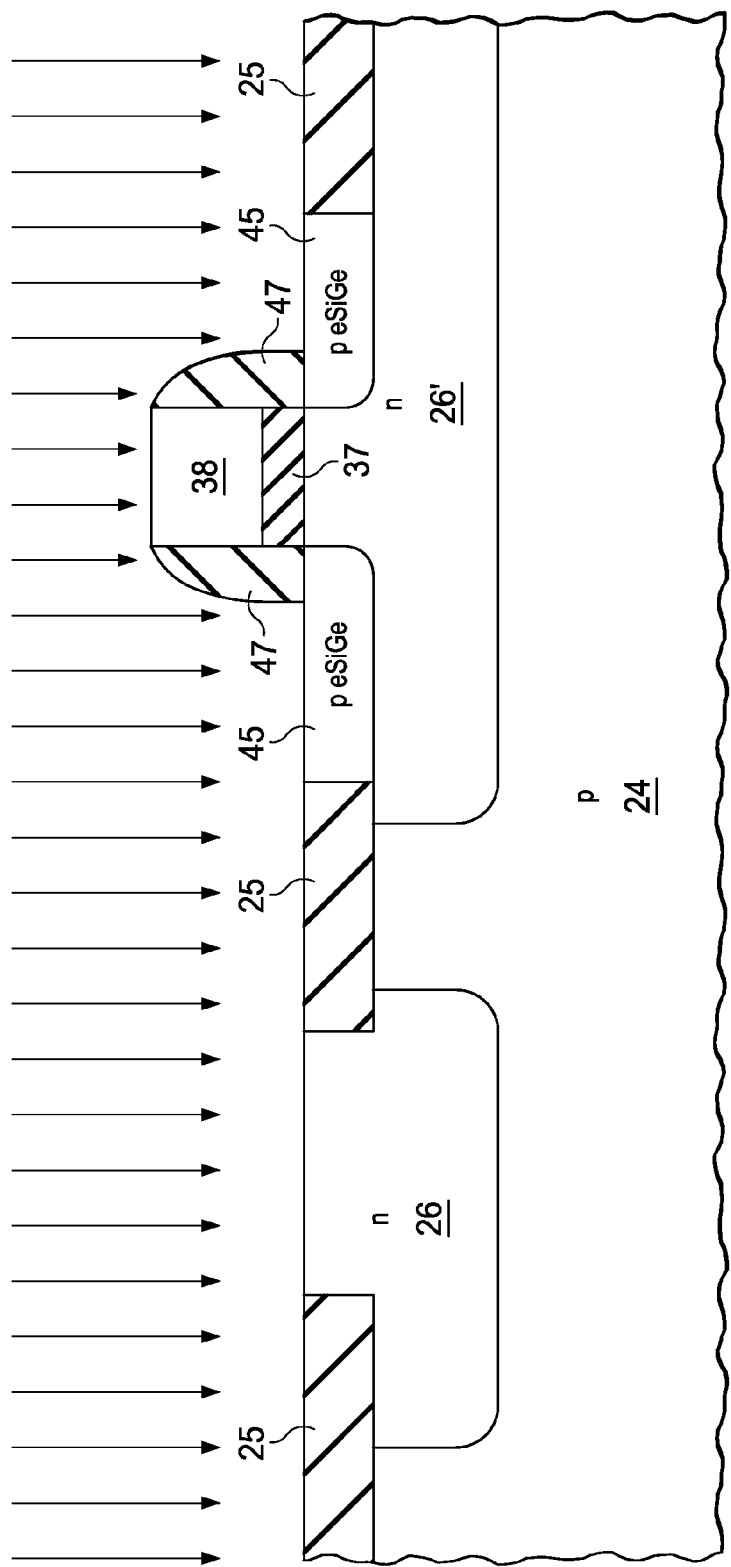

P-type doping of eSiGe structures 45 may be performed in situ during selective epitaxial formation. In this embodiment of the invention, as is typical for eSiGe p-channel MOS transistor formation, an additional source/drain implant is also performed to increase the dopant concentration of these eventual source/drain regions. According to this embodiment of the invention, those locations of the surface of n-well 26 at which guard ring 28 is to be formed also receives this source/drain implant. Accordingly, as shown in FIG. 4f, hard mask layer 41 is removed in the conventional manner, exposing the surface of n-well 26 to receive the p-type source/drain implant. In addition, also as shown in FIG. 4f, hard mask 39 in the gate stack can also be removed prior to source/drain implant. Sidewall spacers 47 may be formed on the side of gate element 38, by conventional oxide or nitride deposition and anisotropic etch, to define source/drain extensions and thus a graded junction for transistor 30p, if desired. Ion implantation of the appropriate dopant and dose of p-type donor species is then performed, as shown in FIG. 4f, followed by the desired activation anneal of the implanted species to the desired junction depth and concentration profile.

Figure 4G:
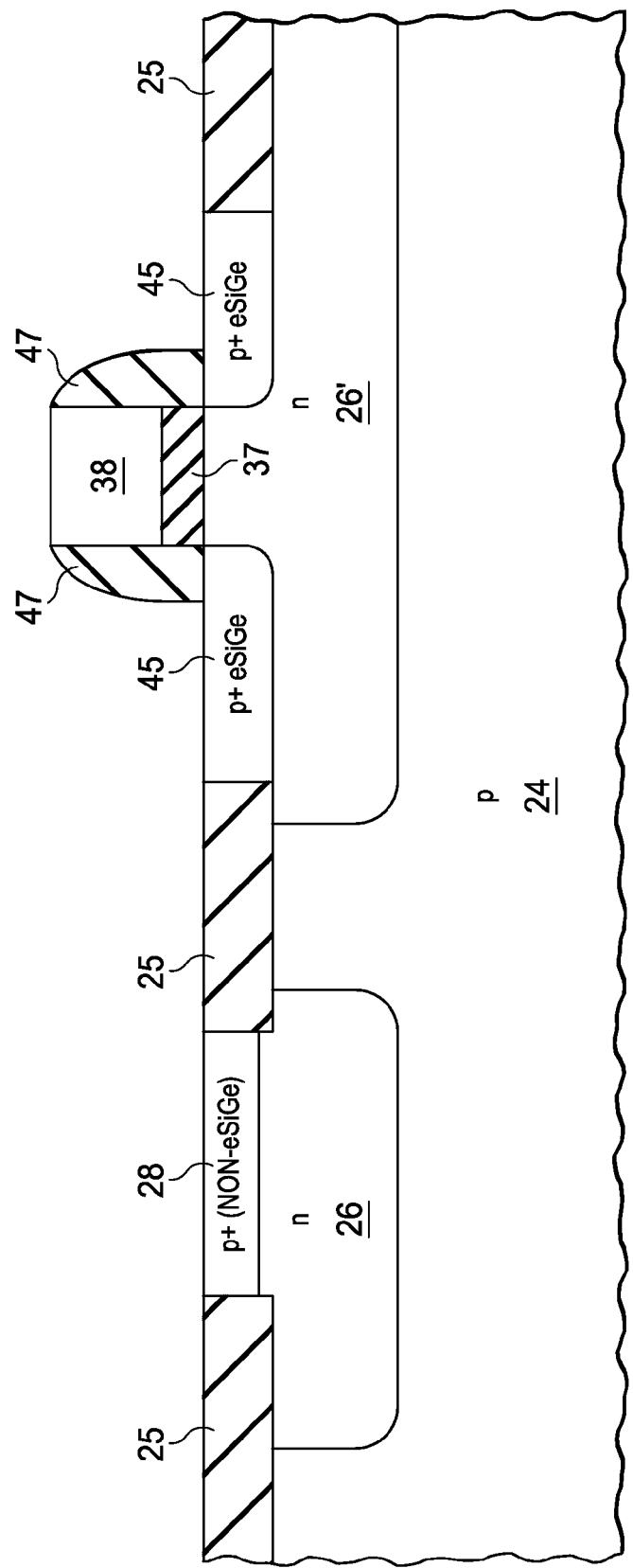

Following implant and anneal, p+ source and drain regions in eSiGe structures 45 on opposite sides of gate element 38 in n-well 26', and p+ guard ring 28 in n-well 26, are formed in the integrated circuit structures, as shown in FIG. 4g. As described above, guard ring 28 is constructed as a doped region in the single-crystal silicon of substrate 24 (more specifically, n-well 26 in substrate 24), while the source and drain regions of transistor 30p are formed in eSiGe structures 45.

As evident from this description, the construction of this integrated circuit shown in FIGS. 3a and 4g is compatible with conventional CMOS processes including the use of eSiGe for carrier mobility enhancement of p-channel MOS transistors. It is contemplated that this invention, in which guard ring 28 in single-crystal silicon is formed in such an integrated circuit, will be enabled by circuit and layout design rules that permit (or require) the formation of relatively large and cornered p+ regions, including those forming a closed loop such as a guard ring and also those merely extending for a certain distance, as doped regions in the underlying single-crystal silicon, rather than as eSiGe. Conversely, those design rules can prohibit the formation of those large and cornered p+ structures as eSiGe structures. It is contemplated that photomasks and the like can be generated in the usual automated manner according to those design rules, and seamlessly incorporated into the process flow.

The structure of FIG. 4g can then be completed, in the conventional manner, by way of the formation and patterning of the appropriate overlying metal conductors, interlevel dielectric or insulator films, and contacts and vias to provide electrical connection among the overlying conductors, and between those conductors and active or conductive elements in the structure of FIG. 4g, including guard ring 28, source and drain regions of transistor 30p as formed in eSiGe structures 45, gate element 38, and the like.

According to embodiments of this invention, therefore, integrated circuit structures can be fabricated in which selected active regions, such as source and drain regions of p-channel MOS transistors, are constructed as embedded silicon-germanium alloy structures, while guard ring structures of the same conductivity type are formed in single-crystal silicon to reduce the vulnerability of those structures to stressinduced defects and perhaps junction shorting. These structures can be constructed, according to this invention, in a manner compatible with modern CMOS and eSiGe processing, with little or no impact on chip layout or the fabrication process. In addition, the avoiding of eSiGe construction for guard rings and similar structures has minimal impact on the electrical performance of the integrated circuit, considering that carrier mobility enhancement is unimportant to such structures.

It is contemplated that variations to the embodiments of this invention will be apparent to those skilled in the art having reference to this specification. For example, while embodiments of this invention have been described in connection with p-channel MOS transistors and p-type guard rings, it is contemplated that this invention may also be applied to n-channel MOS transistors and n-type guard rings, to the extent that eSiGe and similar technology is applicable to such devices.

Therefore, while the present invention has been described according to certain of its embodiments, it is contemplated that modifications of, and alternatives to, these embodiments, such modifications and alternatives obtaining the advantages and benefits of this invention, will be apparent to those of ordinary skill in the art having reference to this specification and its drawings. It is contemplated that such modifications and alternatives are within the scope of this invention as subsequently claimed herein.

What is claimed is:

1. A method of fabricating an integrated circuit at a semiconducting surface of a body, comprising:
    forming a mask layer over a first active region at the surface, the first active region including a corner portion;
    then etching a portion of a second active region at the surface to form a recess into the semiconducting body;
    then depositing an alloy of silicon and germanium into the recess;
    after the etching step, removing the mask layer; and
    doping a surface portion of the first active region, and the deposited alloy to a first conductivity type.

2. The method of claim 1, further comprising:
    forming well regions of a second conductivity type at the surface;
    wherein the first and second active regions are disposed at one or more of the well regions.

3. The method of claim 1, wherein the depositing step is performed by selective epitaxy.

4. The method of claim 1, wherein the step of removing the mask layer is performed after the depositing step.

5. The method of claim 1, wherein the doping step comprises:
    implanting dopant ions of the first conductivity type into the surface portion of the first active region.

6. The method of claim 5, wherein the doping step further comprises:
    doping the deposited alloy in situ during the depositing step.

7. The method of claim 1, wherein the implanting step further comprises:
    implanting dopant ions of the first conductivity type into the deposited alloy.

8. The method of claim 1, further comprising:
    depositing a gate layer;
    forming a gate mask layer over the gate layer to define a gate electrode portion overlying the second active region and expose portions of the gate layer elsewhere;
    etching the exposed portions of the gate layer; and
    wherein the step of etching a portion of a second active region at the surface to form the recess into the semiconducting body etches portions of the second active region adjacent to the gate layer, using the remaining gate layer and gate mask layer as a mask.

9. The method of claim 8, further comprising:
    removing the gate mask layer after the step of etching the exposed portions of the gate layer to form the recess.

* * * * *